(12) United States Patent
Yuan

(10) Patent No.: US 8,860,472 B2
(45) Date of Patent: Oct. 14, 2014

(54) POWER SWITCH DRIVING CIRCUITS AND SWITCHING MODE POWER SUPPLY CIRCUITS THEREOF

(71) Applicant: Silergy Semiconductor Technology (Hangzhou) Ltd, Hangzhou (CN)

(72) Inventor: Xiaolong Yuan, Hangzhou (CN)

(73) Assignee: Silergy Semiconductor Technology (Hangzhou) Ltd, Hangzhou (CN)

( * ) Notice: Subject to any disclaimer, the term of this patent is extended or adjusted under 35 U.S.C. 154(b) by 15 days.

(21) Appl. No.: 13/868,830

(22) Filed: Apr. 23, 2013

(65) Prior Publication Data

US 2013/0300461 A1    Nov. 14, 2013

(30) Foreign Application Priority Data

May 9, 2012    (CN) .......................... 2012 1 0142372

(51) Int. Cl.
*H03K 3/00*     (2006.01)
*H03K 17/06*    (2006.01)

(52) U.S. Cl.
CPC .................................. *H03K 17/063* (2013.01)
USPC ........................................................ 327/109

(58) Field of Classification Search
None
See application file for complete search history.

(56) References Cited

U.S. PATENT DOCUMENTS

| | | | |
|---|---|---|---|
| 7,471,121 B2 | 12/2008 | Yang | |
| 2009/0315595 A1* | 12/2009 | Nakagawa | ..................... 327/109 |
| 2013/0038307 A1* | 2/2013 | Saito et al. | ..................... 323/283 |
| 2013/0285710 A1* | 10/2013 | Knoedgen | ..................... 327/109 |

* cited by examiner

*Primary Examiner* — Lincoln Donovan
*Assistant Examiner* — Khareem E Almo
(74) *Attorney, Agent, or Firm* — Michael C. Stephens, Jr.

(57) ABSTRACT

In one embodiment, a power switch driving circuit can include: (i) a first circuit configured receiving a control signal, and controlling a first transistor gate, where a first transistor source is coupled to a power supply, and a first transistor drain is coupled to a driving signal configured to control a power switch; (ii) a second circuit configured to receive the control signal, and to control a second transistor gate, where a second transistor source is coupled to ground, and a second transistor drain is coupled to the driving signal; and (iii) a driving enhancement circuit having a third transistor and a first inverter that is configured to invert an output of the first circuit to control a third transistor gate, where a third transistor source is coupled to the driving signal, and a third transistor drain is coupled to the power supply.

9 Claims, 7 Drawing Sheets

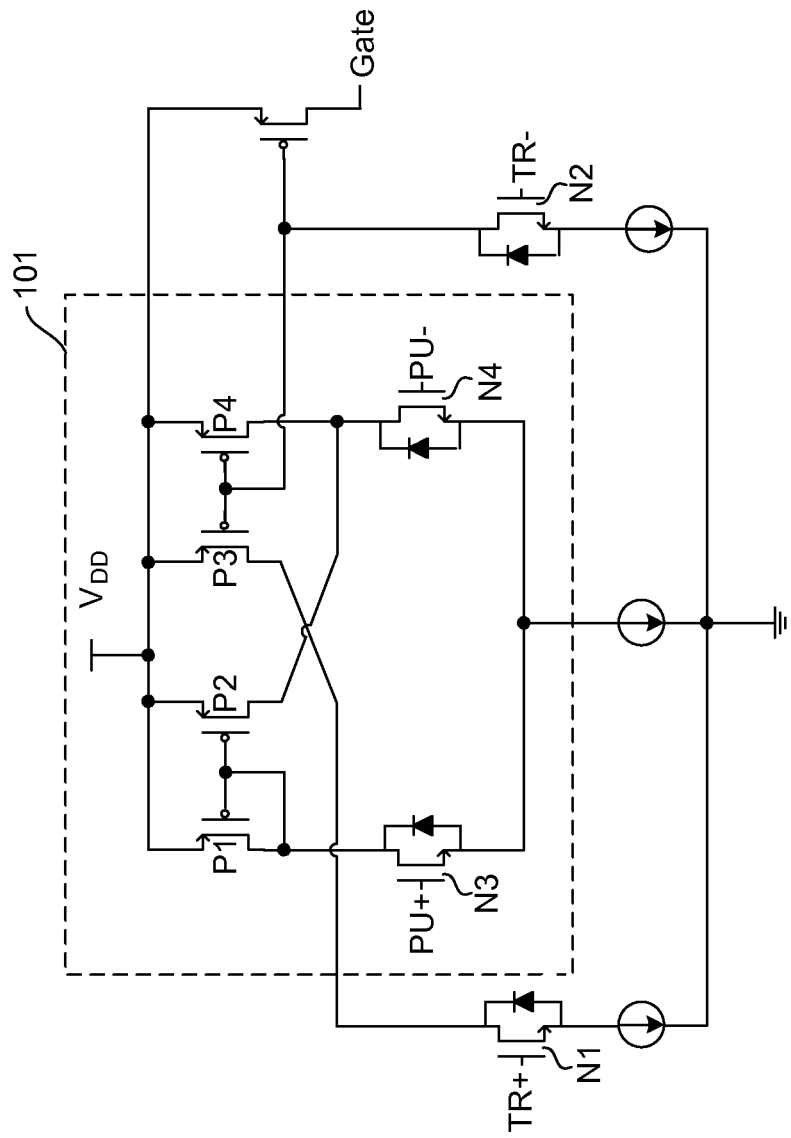
FIG. 1 (conventional)

US 8,860,472 B2

POWER SWITCH DRIVING CIRCUITS AND SWITCHING MODE POWER SUPPLY CIRCUITS THEREOF

RELATED APPLICATIONS

This application claims the benefit of Chinese Patent Application No. 201210142372.9, filed on May 9, 2012, which is incorporated herein by reference in its entirety.

FIELD OF THE INVENTION

The present invention pertains to power supplies, and more particularly to power switch driving circuits and switch mode power supply circuits.

BACKGROUND

With reference to FIG. 1, a conventional power switch driving circuit is shown. In operation, a received control signal (e.g., a pulse-width modulation [PWM] signal) can be converted to a pair of differential signals (e.g., TR+ and TR−). Differential signals TR+ and TR− can be input to control nodes of NMOS transistors N1 and N2, respectively. Also, driving ability can be enhanced by latched comparator 101 that includes NMOS transistors N3 and N4, and PMOS transistors P1-P4. Example driving signals for N1-N4 can be seen in FIG. 2, where driving signal "gate" for the power switch can be generated by controlling the MOS transistors. However, drawbacks of this approach include latched comparator 101 having four PMOS transistors P1-P4, thereby resulting in a relatively larger layout area and increased product costs.

SUMMARY

In one embodiment, a power switch driving circuit can include: (i) a first circuit configured to receive a control signal, and to control a gate of a first transistor, where a source of the first transistor is coupled to an input power supply, and a drain of the first transistor is coupled to a driving signal that is configured to control a power switch based on the control signal; (ii) a second circuit configured to receive the control signal, and to control a gate of a second transistor to execute an opposite switching action from that of the first transistor, where a source of the second transistor is coupled to ground, and a drain of the second transistor is coupled to the driving signal; and (iii) a driving enhancement circuit having a third transistor and a first inverter, where the first inverter is configured to invert an output of the first circuit to control a gate of the third transistor, where a source of the third transistor is coupled to the driving signal, and a drain of the third transistor is coupled to the input power supply.

In another embodiment, a switching mode power supply circuit can include: (i) the driving circuit as above; (ii) a control circuit configured to generate the control signal; and (iii) the power switch controllable by the driving signal based on the control signal.

Embodiments of the present invention can advantageously provide several advantages over conventional approaches. For example, particular embodiments can provide a reduced layout area of power switch driving circuitry, and reduced associated product costs. Other advantages of the present invention may become readily apparent from the detailed description of preferred embodiments below.

BRIEF DESCRIPTION OF THE DRAWINGS

FIG. 1 shows a schematic diagram of an example conventional power switch driving circuit.

DETAILED DESCRIPTION

Figure 2:
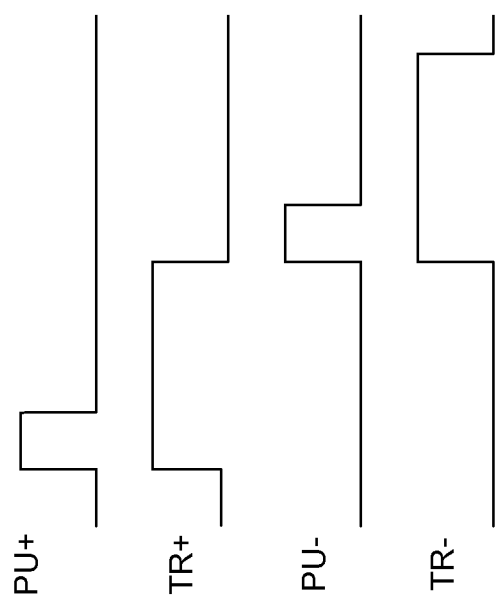
FIG. 2 shows a waveform diagram of example driving signals for transistors N1-N4 of the example driving circuit of FIG. 1.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set fourth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In particular embodiments, a power switch driving circuit and a switching mode power circuit can control a PMOS transistor and an NMOS transistor coupled between a supply voltage and ground to execute opposite switching actions based on a control signal. A driving signal can be generated at a common node of the PMOS and NMOS transistors. In addition, a driving enhancement circuit can be included at a gate of the PMOS transistor to improve the driving ability of the PMOS transistor. In this way, a relatively small layout area may be occupied by the PMOS transistor, the overall cost can be reduced, and the driving speed can be increased, as compared to conventional approaches. Also, a power switch driving circuit of particular embodiments can drive any type of power switches, such as MOS transistors.

In one embodiment, a power switch driving circuit can include: (i) a first circuit configured to receive a control signal, and to control a gate of a first transistor, where a source of the first transistor is coupled to an input power supply, and a drain of the first transistor is coupled to a driving signal that is configured to control a power switch based on the control signal; (ii) a second circuit configured to receive the control signal, and to control a gate of a second transistor to execute an opposite switching action from that of the first transistor, where a source of the second transistor is coupled to ground, and a drain of the second transistor is coupled to the driving signal; and (iii) a driving enhancement circuit having a third transistor and a first inverter, where the first inverter is configured to invert an output of the first circuit to control a gate of the third transistor, where a source of the third transistor is coupled to the driving signal, and a drain of the third transistor is coupled to the input power supply.

In another embodiment, a switching mode power supply circuit can include: (i) the driving circuit as above; (ii) a control circuit configured to generate the control signal; and (iii) the power switch controllable by the driving signal based on the control signal.

Figure 3:
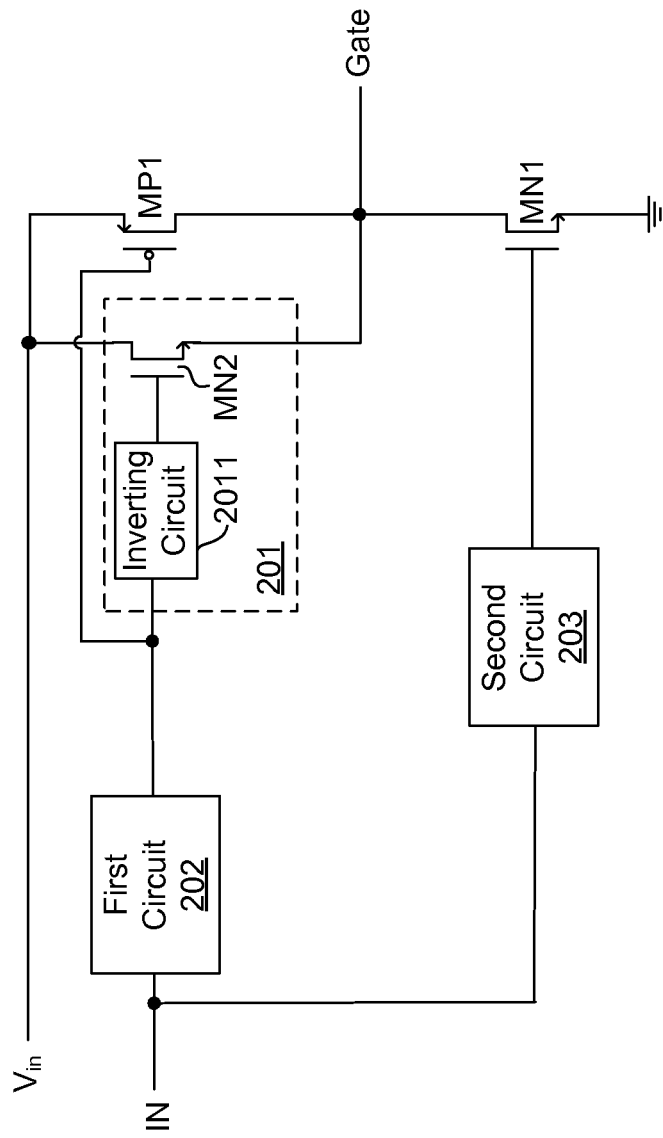
FIG. 3 shows a schematic block diagram of an example power switch driving circuit in accordance with embodiments of the present invention.

Referring now to FIG. 3, shown is an example power switch driving circuit in accordance with embodiments of the present invention. Control signal IN can be received (e.g., from separate control circuitry), and driving signal GATE can be output to drive one or more power switches. For example, driving signal GATE can connect to a gate of a MOS transistor type of power switch to control the power switch. The power switch driving circuit can include PMOS transistor MP1, NMOS transistor MN1, first circuit 202, second circuit 203, and driving enhancement circuit 201.

The source of transistor MP1 can connect to input power supply $V_{in}$, the drain of transistor MP1 can connect to the drain of transistor MN1, and the source of transistor MN1 can connect to ground. The common node of transistor MP1 and transistor MN1 can be configured as an output terminal of driving signal GATE. The gate of transistor MP1 can connect with the output terminal of first circuit 202, and an input terminal of first circuit 202 can receive control signal IN. The gate of transistor MN1 can connect to an output terminal of second circuit 203, and an input terminal of second circuit 203 can receive control signal IN.

Driving enhancement circuit 201 can include transistor MN2 and inverting circuit 2011. The drain of transistor MN2 can connect with input power supply $V_{in}$, and the gate of transistor MN2 can connect with an output terminal of inverting circuit 2011. The input of inverting circuit 2011 can connect with the output terminal of first circuit 202, and the source of transistor MN2 can connect with the output of driving signal GATE. Control transistor MP1 and transistor MN1 can execute opposite switching actions through first circuit 202 and second circuit 203, respectively, based on control signal IN. Also, driving signal GATE can be output to drive one or more power switches. The common node of transistors MP1 and MN1 can be configured as the output terminal of driving signal GATE.

Various voltage levels of control signal IN, input power supply $V_{in}$, and driving signals for the MOS transistors. For example, control signal IN can have a voltage in a range of from about 0V to about 3V, while the input power supply can be in a range of from about 4.5V to about 15V (e.g., about 12V). Thus, level shifting may be utilized to convert control signal IN between different voltage supply levels (e.g., 3V and 12V, etc.), and to ensure appropriate switching actions of transistors MP1 and MN1.

Figure 4:
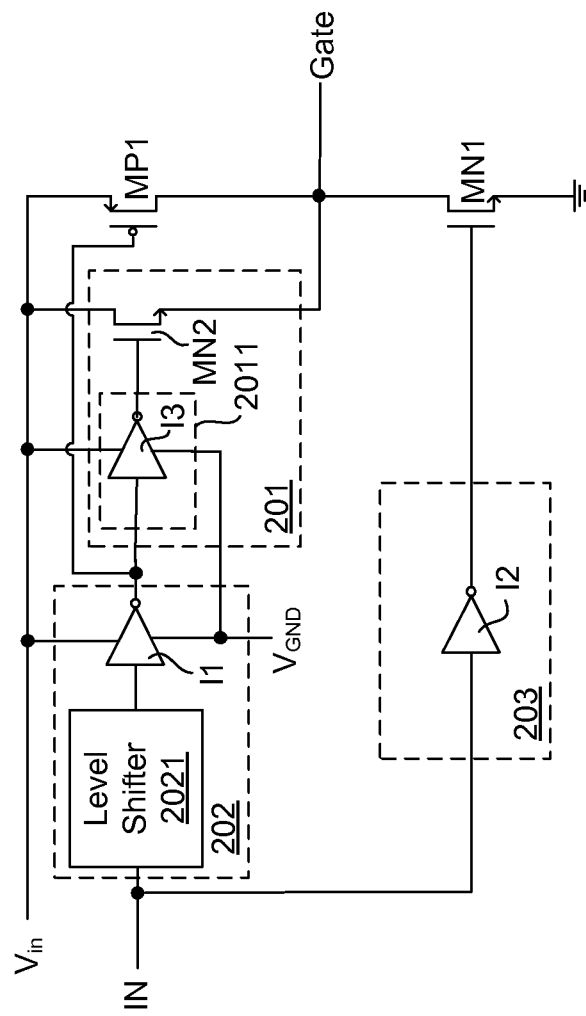
FIG. 4 shows a more detailed schematic block diagram of an example driving circuit in accordance with embodiments of the present invention.

Referring now to FIG. 4, first circuit 202 in this example driving circuit can include level shifter 2021 and inverter I1, in accordance with embodiments of the present invention. Level shifter 2021 can receive control signal IN, and an output thereof can be input to the gate of transistor MP1 after being inverted by inverter I1. Second circuit 203 can include inverter I2, and an inverted version of control signal IN can be input to the gate of transistor MN1 via inverter I2. Inverting circuit 2011 can include inverter I3.

When control signal IN is active high (e.g., logic level '1'), it can be converted to a low level (e.g., logic level '0') through level shifter 2021 and inverter I1 to turn on transistor MP1. Also, control signal IN can be used to turn off transistor MN1 through inverter I2. Under this condition, the output driving signal GATE can be in a high level active state. Correspondingly, when control signal IN is low, transistor MP1 may be turned off and transistor MN1 may be turned on. Therefore, driving signal GATE may be pulled down to a low level inactive state.

Considering the driving ability of a PMOS transistor is typically lower than that of a same sized NMOS transistor, driving enhancement circuit 201 may be utilized in particular embodiments to enhance a driving ability of transistor MP1. Because the on-resistance of an NMOS transistor may be about one-third that of a corresponding PMOS transistor, charging time for a parasitic capacitance of the NMOS transistor can be much less than that of the corresponding PMOS transistor. When control signal IN is in a high level state, transistors MN2 and MP1 can be turned on substantially simultaneously, and transistor MN2 can provide a path to pull up driving signal GATE to input power supply $V_{in}$ much faster than transistor MP1. In this way, the driving ability of transistor MP1 can be enhanced by the fast charging action (e.g., including of parasitic capacitance) of transistor MN2.

Control signal IN can be in a range of from about 0V (e.g., a logic low level) to about 3V (e.g., a level of the supply driving control signal IN), and may control transistor MN1 without level shifting (e.g., through inverting via inverter I2). However, in some cases a level shifter can be included in second circuit 203 to process control signal IN, such as when additional drive is needed on transistor MN1 (e.g., to discharge driving signal GATE faster), and control signal IN can be input to inverter I2 after being level shifted.

Figure 5:
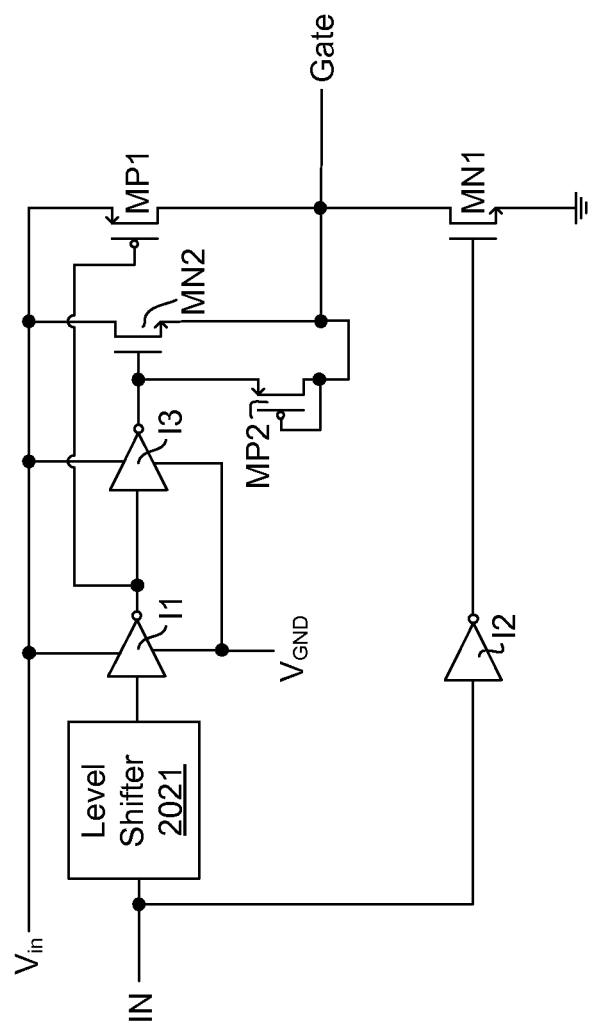
FIG. 5 shows a schematic block diagram of a second example driving circuit in accordance with embodiments of the present invention.

Referring now to FIG. 5, a diode-connected transistor MP2 can be added to the example circuits discussed above, in accordance with embodiments of the present invention. The source of transistor MP2 can connect to the gate of transistor MN2, where a common node can connect to the source of transistor MN2. When the gate voltage of transistor MN2 becomes a threshold voltage higher than driving signal GATE, transistor MP2 can be turned on automatically to clamp the gate voltage of transistor MN2.

Transistor MP1 can be any suitable type of transistor or switching device. For example, MP1 can be a double-diffused metal-oxide semiconductor (DMOS) transistor or a CMOS device. If transistor MP1 is a DMOS device (e.g., in BICMOS process), the source-drain voltage of MP1 can usually endure a relatively high voltage (e.g., higher than about 10V), but the gate-source voltage can usually endure a voltage lower than about 5V. Accordingly, the gate voltage of transistor MP1 may be clamped in some cases, such as high voltage applications.

Figure 6:
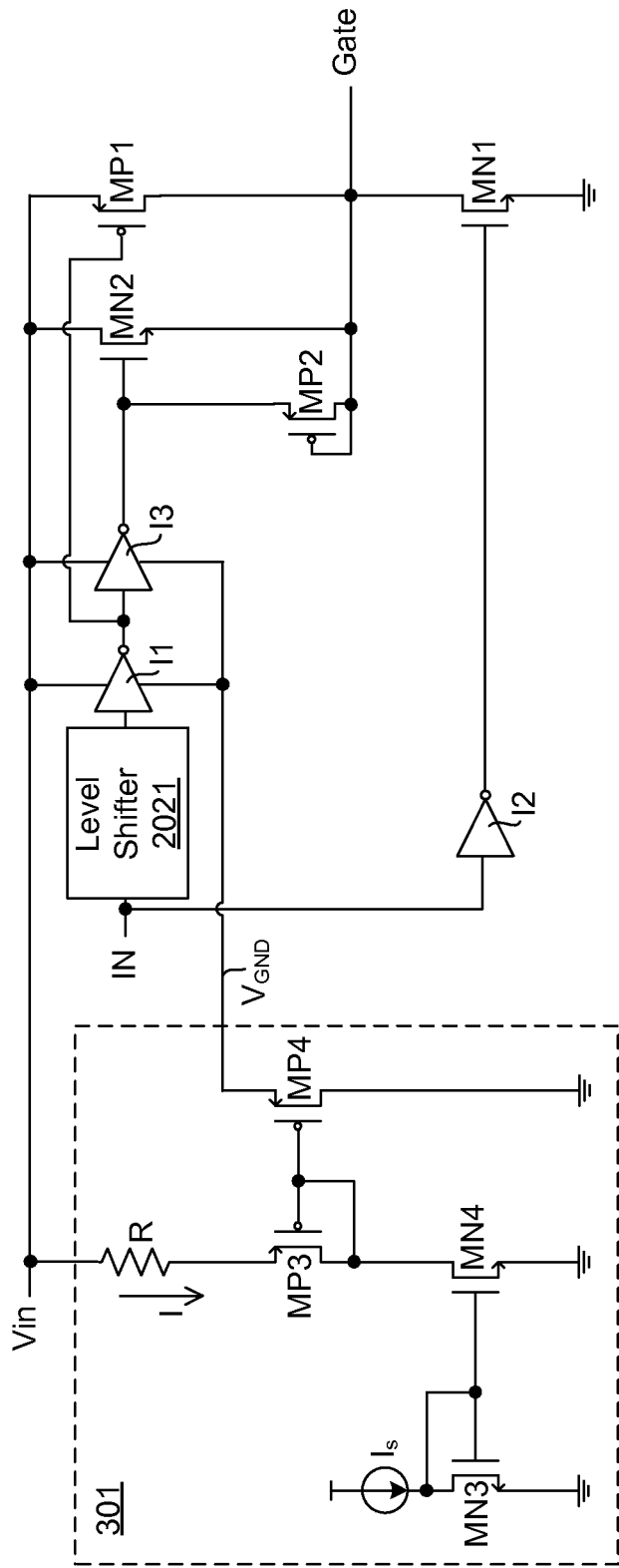
FIG. 6 shows a schematic block diagram of a third example driving circuit in accordance with embodiments of the present invention.

Referring now to FIG. 6, shown is an example driving circuit that includes clamping circuit 301, in accordance with embodiments of the present invention. Clamping circuit 301 can be used to ensure the gate-source voltage of transistor MP1 is less than a predetermined value by controlling a voltage difference between supply rails of inverter I1. For example, the predetermined value can be in a range of from about 2V to about 6V (e.g., 3V, 5V, etc.), depending on the particular application.

Clamping circuit 301 can include current source $I_s$, a current mirror that includes transistors MN3 and MN4, dividing resistor R, and a buffer circuit that includes transistors MP3 and MP4. In this particular example, the drain of transistor MN3 can connect with the gate thereof to receive current source L. Also, the source of transistor MN3 can connect to ground. The gate of transistor MN4 can connect with the gate of transistor MN3, the source of transistor MN4 can connect to ground, and the drain of transistor MN4 can connect to the drain and gate of transistor MP3. The source of transistor MP3 can connect to one terminal of dividing resistor R, and the other terminal of dividing resistor R can receive input power $V_{in}$. Also, the gate of transistor MP4 can connect with the gate of transistor MP3, the drain of transistor MP4 can connect to ground, and the source of transistor MP4 can connect to a negative terminal of inverters I1 and I3, where the potential at the negative terminal can be configured as $V_{GND}$.

Current source $I_s$ can be amplified to be current I through a current mirror formed by transistor MN3 and transistor MN4. Current I can produce a voltage drop IR across dividing resistor R. Also, through a buffer effect due to a buffer circuit that includes transistors MP3 and MP4, voltage $V_{GND}$ at the negative terminal of inverter I1 can be $V_{in}$-IR. Therefore, the voltage difference between the supply rails $V_{in}$ and $V_{GND}$ for inverters I1 and I3 can be the voltage drop IR across dividing resistor R. By setting current source $I_s$, dividing resistor R and/or magnification of the current mirror, etc., voltage drop IR can be obtained as the predetermined value (e.g., about 3V). In this way, the gate-source voltage of transistor MP1 can be maintained as less than the predetermined value.

Figure 7:
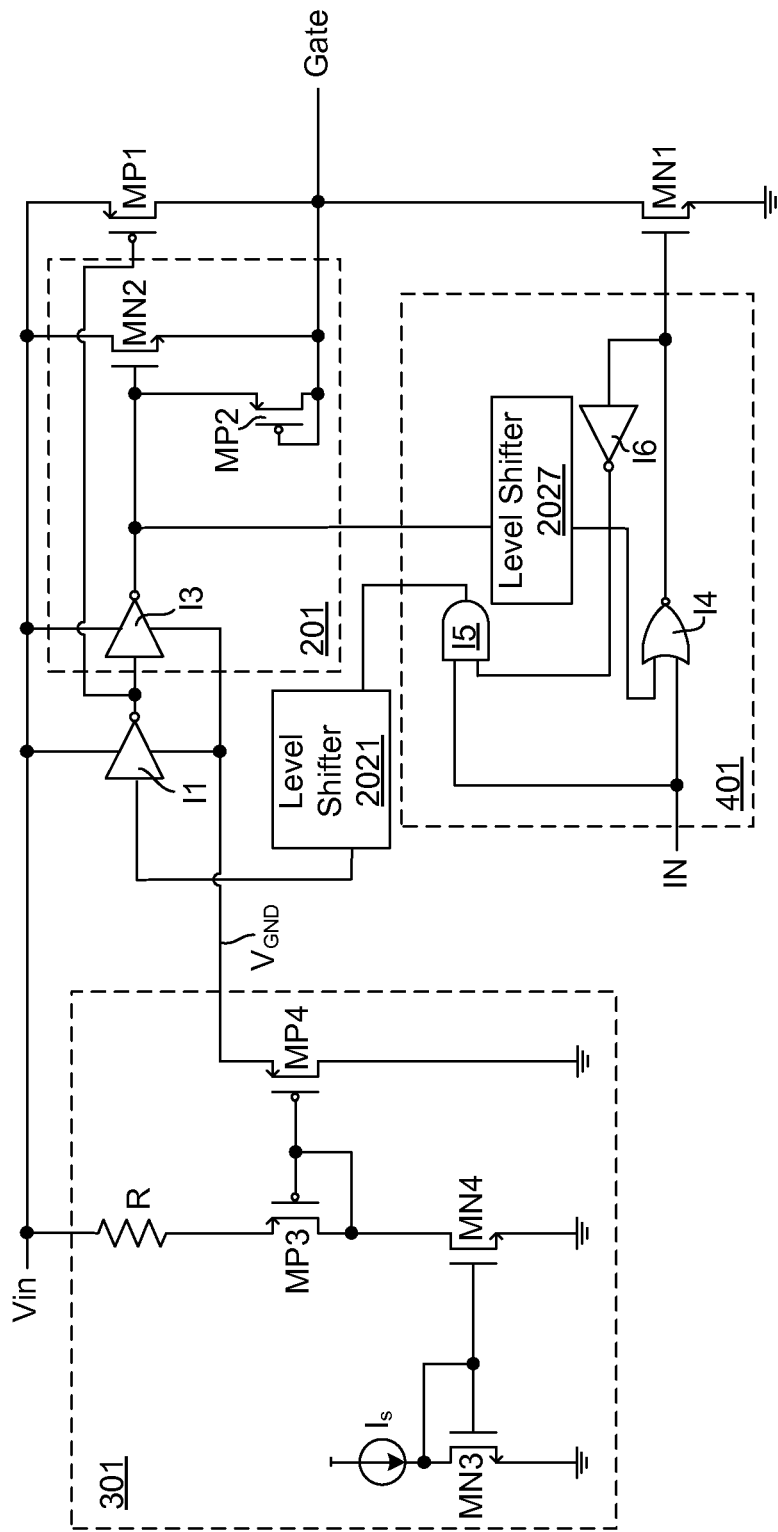
FIG. 7 shows a schematic block diagram of a fourth example driving circuit in accordance with embodiments of the present invention.

Referring now to FIG. 7, shown is an example driving circuit that includes protection circuit 401, in accordance with embodiments of the present invention. In this particular example, protection circuit 401 can include NOR-gate I4, AND-gate I5, and inverter I6. A first input terminal of NOR-gate I4 can receive a level shifted (e.g., via level shifter 2027) and inverted (e.g., via inverter I3) version of the gate control signal of transistor MP1. The second input terminal of NOR-gate I4 can receive control signal IN, and the output terminal of NOR-gate I4 can connect to the gate of transistor MN1. After been inverted by inverter I6, the output of NOR-gate I4 can be input to a first input terminal of AND-gate I5. Also, the second input terminal of AND-gate I5 can receive control signal IN, and the output of AND-gate I5 can connect to an input of level shifter 2021.

When control signal IN is in a high level active state, the output of NOR-gate I4 can go low, thereby turning off transistor MN1. Although control signal IN input to one terminal of AND-gate I5 is high, the output of inverter I6 can only go high when transistor MN1 is off. Thus, the output of AND-gate I5 can be high, and transistor MP1 can be turned on through level shifter 2021 and inverter I1, and may activate driving signal GATE. In this way, transistor MP1 can be ensured to be turned on only when transistor MN1 is off.

Similarly, when control signal IN is low, the condition for generating a low level signal at the other input terminal of NOR-gate I4 is as follows. When the output of inverter I1 is high (transistor MP1 is off), the output of inverter I3 can go low. The output of inverter I3 can be input to NOR-gate I4 through the level shifter circuit 2027, so the output of NOR-gate I4 can go high, thereby turning on transistor MN1. In this way, protection circuit 401 can utilize logic circuits to effectively prevent a short circuit situation caused by simultaneously turning on transistors MP1 and MN1.

As NOR-gate I4 in this particular example has replaced inverter I2 shown in FIGS. 3-6, the output of NOR-gate I4 can be directly output to the gate of transistor MN1. Also, control signal IN may be in a range of from about 0V to about 3V, so it may not be necessary to level shift control signal IN. Thus, control signal IN may be directly input to NOR-gate I4. However, if control signal IN is a voltage level that is in another range, it may be input to NOR-gate I4 and/or AND-gate I5 after being level shifted, in some cases.

The present invention may also provide a switching mode power supply circuit, which can include any driving circuit described above, and power stage and control circuits. For example, the control circuit can output a control signal to control a power switch in the power stage circuit. Also, the driving circuit can receive the control signal, and may output a driving signal to control the power switch.

In particular embodiments, power switch driving circuitry can drive any type of power switches (e.g., MOSFETs). Also, a power switching driving circuit can be coupled with any of a wide variety of power stage and control circuits. In summary, particular embodiments can provide power switching driving circuits that can reduce layout area and associated product costs, as compared to conventional approaches.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A power switch driving circuit, comprising:
a) a first circuit configured to receive a control signal, and to control a gate of a first transistor, wherein a source of said first transistor is coupled to an input power supply, and a drain of said first transistor is coupled to a driving signal that is configured to control a power switch based on said control signal, said first circuit comprising a first level shifter configured to receive said control signal and a first inverter configured to invert an output from said first level shifter, to provide said control for said gate of said first transistor;
b) a second circuit configured to receive said control signal, and to control a gate of a second transistor to execute an opposite switching action from that of said first transistor, wherein a source of said second transistor is coupled to ground, and a drain of said second transistor is coupled to said driving signal; and
c) a driving enhancement circuit having a third transistor and a second inverter, wherein said second inverter is configured to invert an output of said first circuit to control a gate of said third transistor, wherein a source of said third transistor is coupled to said driving signal, and a drain of said third transistor is coupled to said input power supply.

2. The driving circuit according to claim 1, wherein said second circuit comprises a third inverter configured to receive said control signal, and to provide said control for said gate of said second transistor.

3. The driving circuit according to claim 1, wherein said driving enhancement circuit further comprises a fourth transistor having a source coupled to said gate of said third transistor, said fourth transistor having a drain and a gate coupled to said driving signal.

4. The driving circuit according to claim 1, wherein said first transistor comprises a double-diffused metal-oxide semiconductor (DMOS) device.

5. The driving circuit according to claim 1, further comprising a clamping circuit configured to clamp a gate-source voltage of said first transistor to be less than or equal to a predetermined value by controlling a voltage difference between positive and negative terminals of said second inverter.

6. The driving circuit according to claim 5, wherein said clamping circuit comprises:
a) a current mirror configured to mirror a current source to generate an amplified current, and to produce a voltage drop across a dividing resistor; and
b) a buffer circuit coupled to said current mirror and said negative terminal of said second inverter, wherein said voltage difference between said positive and negative terminals of said second inverter is substantially equal to said voltage drop across said dividing resistor.

7. The driving circuit according to claim 1, further comprising a protection circuit configured to receive said control signal, and to provide an output to said first and second circuits that is used to avoid said first and second transistors being turned on at a same time.

8. The driving circuit according to claim 7, wherein said protection circuit comprises:
   a) a NOR-gate configured to receive said control signal and said second transistor gate control, and to provide an output to said to said second circuit;
   b) a fourth inverter configured to invert said output from said NOR-gate, and to provide a fourth inverter output;
   c) an AND-gate configured to receive said fourth inverter output and said control signal, and to provide an output to said first circuit.

9. A switching mode power supply circuit, comprising:
   a) the driving circuit of claim 1;
   b) a control circuit configured to generate said control signal; and
   c) wherein said power switch is controllable by said driving signal based on said control signal.

* * * * *